United States Patent
Jacobs, II

(10) Patent No.: US 12,190,359 B2
(45) Date of Patent: *Jan. 7, 2025

(54) METHODS AND SOFTWARE FOR ENABLING CUSTOM PRICING IN AN ELECTRONIC COMMERCE SYSTEM

(71) Applicant: Desprez, LLC, New London, NH (US)

(72) Inventor: James L Jacobs, II, Nashua, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/877,103

(22) Filed: Jul. 29, 2022

(65) Prior Publication Data

US 2022/0374953 A1    Nov. 24, 2022

Related U.S. Application Data

(63) Continuation of application No. 16/730,747, filed on Dec. 30, 2019, which is a continuation of application No. 14/282,773, filed on May 20, 2014, now Pat. No. 10,552,882.

(51) Int. Cl.
| | |
|---|---|
| *G06Q 30/02* | (2023.01) |
| *G05B 19/4099* | (2006.01) |
| *G06F 30/00* | (2020.01) |
| *G06Q 10/06* | (2023.01) |
| *G06Q 30/0283* | (2023.01) |

(52) U.S. Cl.
CPC ..... *G06Q 30/0283* (2013.01); *G05B 19/4099* (2013.01); *G06F 30/00* (2020.01); *G06Q 10/06* (2013.01); *G05B 2219/49007* (2013.01); *G06Q 30/02* (2013.01)

(58) Field of Classification Search
CPC ..... G06F 17/50; G06F 30/00; G06Q 30/0283; G06Q 10/06; G06Q 30/02; G05B 19/4099; G05B 2219/49007

USPC ........ 705/7.35, 400; 700/97; 716/112; 703/1
See application file for complete search history.

(56) References Cited

U.S. PATENT DOCUMENTS

| | | | | |
|---|---|---|---|---|
| 6,496,957 | B1 * | 12/2002 | Kumagai | G06F 30/00 716/112 |
| 7,065,420 | B1 * | 6/2006 | Philpott | G06Q 30/02 703/1 |
| 7,305,367 | B1 * | 12/2007 | Hollis | B33Y 80/00 700/157 |

(Continued)

FOREIGN PATENT DOCUMENTS

WO    WO-2006023877 A2 *    3/2006    ............ G06F 16/116

OTHER PUBLICATIONS

Davis, Gerald; "3-D CAD: Modeling With Product Variation as the Design Intent", Jul. 2012; The Fabricator, 6 pages (Year: 2012).*

(Continued)

*Primary Examiner* — Shannon S Campbell
*Assistant Examiner* — Freda A Nelson
(74) *Attorney, Agent, or Firm* — Caldwell Intellectual Property Law

(57) ABSTRACT

Methods and software that allow one or more users to utilize custom pricing in the context of an electronic marketplace. Such custom pricing can be implemented by transmitting specifications of custom pricing engines and/or custom design document interrogator engines to the marketplace along with or independently from one or more design documents containing structures to be priced. Various corresponding and related methods and software are described.

20 Claims, 4 Drawing Sheets

(56) References Cited

U.S. PATENT DOCUMENTS

| | | | | |
|---|---|---|---|---|
| 11,164,256 B2* | 11/2021 | Ekman | .................... | G06Q 40/08 |
| 2003/0229599 A1* | 12/2003 | Sakurai | .................. | G06Q 10/06 |
| | | | | 700/118 |
| 2006/0253214 A1* | 11/2006 | Gross | ....................... | G06F 30/00 |
| | | | | 705/26.1 |
| 2011/0282476 A1* | 11/2011 | Hegemier | ............ | G06Q 10/087 |
| | | | | 705/26.5 |
| 2014/0228997 A1* | 8/2014 | Phillips | .............. | G05B 19/4097 |
| | | | | 700/182 |
| 2014/0279177 A1* | 9/2014 | Stump | ................ | G06Q 30/0611 |
| | | | | 705/26.4 |
| 2015/0127480 A1* | 5/2015 | Herrman | ............ | G06Q 30/0611 |
| | | | | 705/26.4 |
| 2015/0254693 A1* | 9/2015 | Kozhukhin | ............ | B22D 46/00 |
| | | | | 705/7.35 |

OTHER PUBLICATIONS

Schmitz, Barb, "Will Subscription-based Pricing Models Remove Cost Barriers to 3D CAD?"; Oct. 7, 2013; Engineering.com, 9 pages (Year: 2013).*

Davis, Gerald; "3-D CAD: Modeling With Product Variation as the Design Intent", Jul. 2012; The Fabricator (2012).

\* cited by examiner

METHODS AND SOFTWARE FOR ENABLING CUSTOM PRICING IN AN ELECTRONIC COMMERCE SYSTEM

CROSS-REFERENCE TO RELATED APPLICATIONS

This application is a continuation of Non-provisional application Ser. No. 16/730,747, filed on Dec. 30, 2019 and entitled "METHODS AND SOFTWARE FOR ENABLING CUSTOM PRICING IN AN ELECTRONIC COMMERCE SYSTEM," the entirety of which is incorporated herein by reference. This application is a continuation of Non-provisional application Ser. No. 14/282,773, filed on May 20, 2014, and entitled "METHODS AND SOFTWARE FOR ENABLING CUSTOM PRICING IN AN ELECTRONIC COMMERCE SYSTEM," the entirety of which is incorporated herein by reference.

FIELD OF THE INVENTION

The present invention generally relates to the field of electronic commerce. In particular, the present invention is directed to methods and software for enabling custom pricing in an electronic commerce system.

BACKGROUND

Presently, computer-aided design (CAD) programs allow users (referred to as "designers" herein) to create computer models of products to be manufactured. After a design is complete, the designer typically then seeks out one or more suppliers to which they may send one or more design specifications and requests for pricing in order to obtain one or more prices or price quotes for fabricating the designed structure. Some suppliers utilize automated or semi-automated programs in the process of generating such price quotes, but these programs typically require a specially trained user to provide input, to guide the program's execution, to verify that the program produces reasonable results, and/or to produce a final price quote as a function of results produced by the program. After producing price quotes, the suppliers transmit the quotes to the designer, who then chooses a supplier, typically primarily as a function of their quoted price, to manufacture structures associated with the design specifications. However, difficulties in producing price quotes can lead to higher prices for both designers and suppliers and/or delays in the price-quote generation process, which can result in suppliers missing opportunities as a result of not being able to respond quickly enough to designers' requests for quotes.

SUMMARY OF THE DISCLOSURE

In an aspect a system for creating a custom pricing engine includes a computing device designed and configured to receive a plurality of supplier-specific costs for performing manufacturing processes, store the plurality of supplier-specific costs in a pricing engine variables database, and receive pricing inputs for manufacturing a structure to be manufactured. The system includes custom pricing engine module executing on the computing device and designed and configured to retrieve a first set of supplier-specific costs of a first supplier from the pricing engine variables database, generate at least a first pricing output, wherein generating the at least a first pricing output further includes executing at least a first portion of at least a first pricing engine as a function of the pricing inputs and the first set of supplier specific costs, generate at least a second pricing output, wherein generating at least a second pricing output further includes executing at least a second portion of at least a second pricing engine, as a function of the pricing inputs and the second set of supplier-specific costs, calculate an aggregate price using the at least a first pricing output and the at least a second pricing output, and provide the aggregate price to a user by outputting the aggregate price at an output device.

In another aspect, a non-transitory computer-readable storage medium contains machine-executable instructions for performing a method of creating a custom pricing engine including receiving a plurality of supplier-specific costs for performing manufacturing processes, storing the plurality of supplier-specific costs in a pricing engine variables database, receive pricing inputs for manufacturing a structure to be manufactured, retrieving a first set of supplier-specific costs of a first supplier from the pricing engine variables database, generating at least a first pricing output, wherein generating the at least a first pricing output further includes executing at least a first portion of at least a first pricing engine as a function of the pricing inputs and the first set of supplier specific costs, generating at least a second pricing output, wherein generating at least a second pricing output further includes executing at least a second portion of at least a second pricing engine, as a function of the pricing inputs and the second set of supplier-specific costs, calculating, by the custom pricing engine module, an aggregate price using the at least a first pricing output and the at least a second pricing output, and providing the aggregate price to a user by outputting the aggregate price at an output device.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations, and fragmentary views. In certain instances, details that are not necessary for an understanding of the embodiments or that render other details difficult to perceive may have been omitted.

DETAILED DESCRIPTION

Aspects of the present invention include methods and software for enabling custom pricing in an electronic commerce system that includes a marketplace operable to receive requests for prices for fabricating structures represented and/or specified in a design and prices on projects associated with such requests. Prices may include a price estimate, quote, bid, and/or a firm fixed quote or cost, among others. Examples of structures that may be specified and/or represented in a design include a solid metal cube, an electronic-device chassis formed from sheet metal, an injection molded plastic toy, an article of apparel or clothing such as a shirt made from cotton, and a shelving unit consisting of various parts, among a virtually limitless list of other structures. Fundamentally, there is no limitation on the type of structure that may be represented and/or specified in a design in accordance with the present invention. In some embodiments, methods and software of the present disclosure enable fabrication price requesters (such as designers or purchasing agents associated with designers, among others, referred to collectively as "designers" herein) and structural fabricators/manufacturers (referred to as "suppliers" herein) to benefit from the use of one or more custom pricing engines in the context of an electronic commerce system. Such custom pricing engines can be provided by one or more suppliers, designers, or other entities (referred to as "third parties" herein).

In some embodiments, pricing information can be determined by a custom pricing engine as a function of a structure represented in a design document. The pricing information can then be offered to a user, such as a supplier wishing to generate a price and/or a designer wishing to receive a price. In order to provide the functionality described, the methods and software disclosed herein may be implemented in an electronic marketplace accessible by designers and suppliers. Designers may submit project specifications and requests for prices directly to the marketplace via, for example, an Internet browser or indirectly through a CAD program or other system capable of interfacing with the marketplace and communicating designs thereto; similarly, suppliers may access the marketplace directly through an Internet browser or indirectly through, for example, a supplier's in-house system to review available projects, create a custom pricing engine, generate prices on one or more projects using a custom pricing engine, and/or transmit prices to designers associated with such projects.

Figure 1:
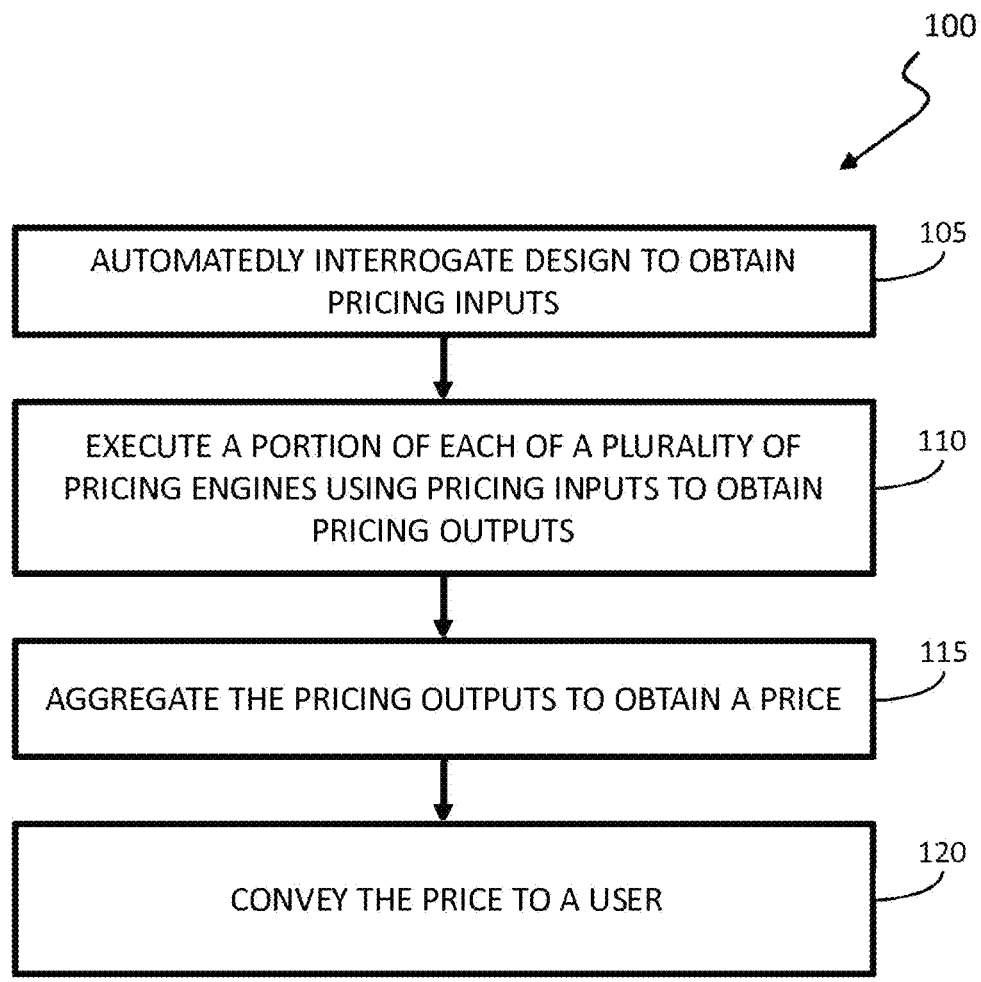
FIG. 1 is a flow diagram illustrating an exemplary method of enabling custom pricing in an electronic commerce system.
Figure 2:
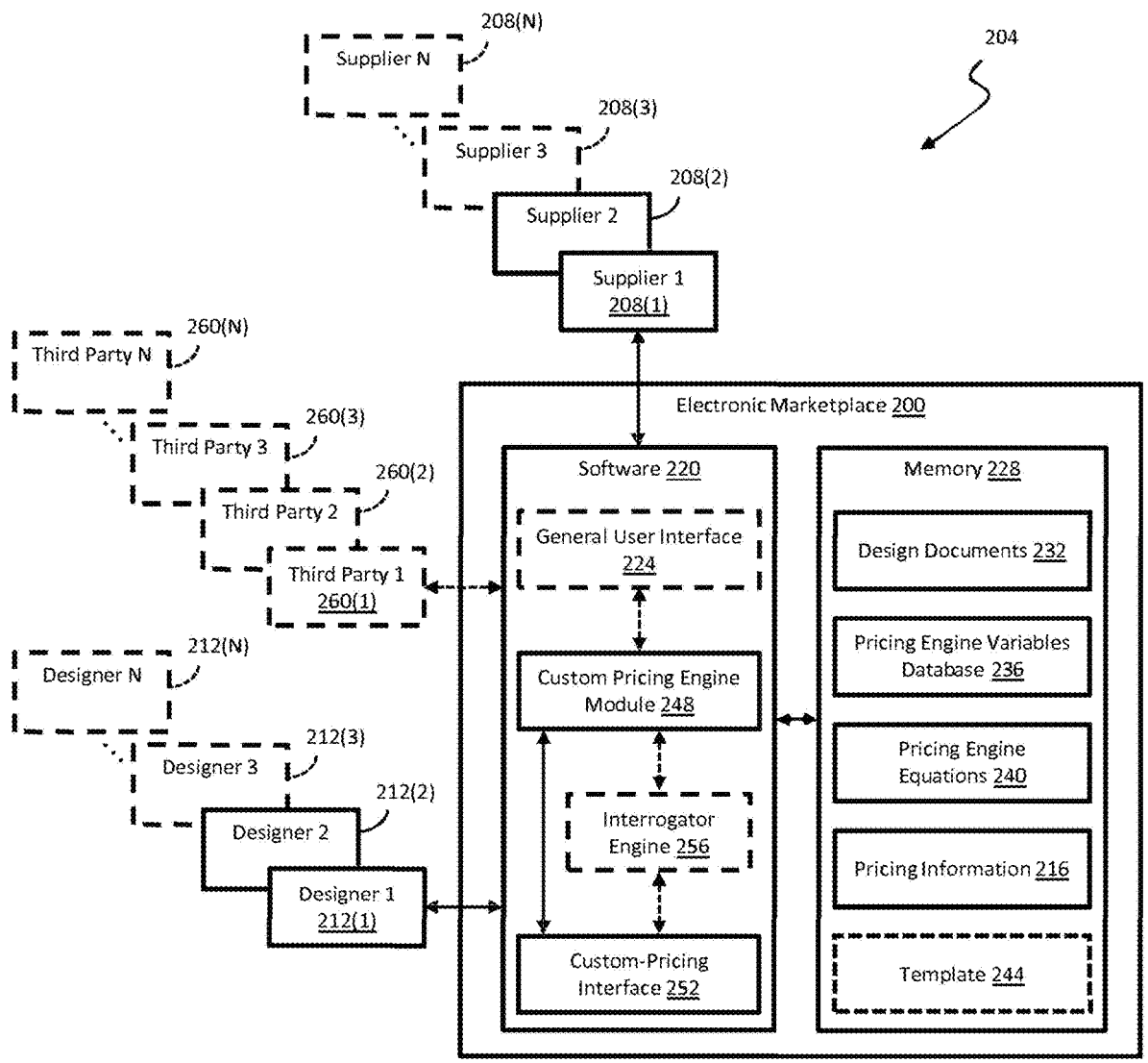
FIG. 2 is a high-level block diagram illustrating an exemplary electronic commerce system that may be used to implement the method of FIG. 1.

Turning now to the drawings, FIG. 1 illustrates an exemplary method 100 of enabling custom pricing in an electronic commerce system for one or more designers and/or suppliers. Method 100 may be implemented in a marketplace, such as in exemplary electronic marketplace 200 within an electronic commerce system 204, as illustrated in FIG. 2, using a computing system, such as computing system 400 of FIG. 4 or a network of such or similar computing systems (e.g., a wide-area network, a global network (such as the Internet), and/or a local area network, among others), that is generally: 1) programmed with instructions for performing steps of a method of the present disclosure; 2) capable of receiving and/or storing data necessary to execute such steps; and 3) capable of providing any user interface that may be needed for a user to interact with the electronic marketplace, including setting the marketplace up for generating pricing information and/or offering such products to designers and/or suppliers, among other things. Those skilled in the art will readily appreciate that aspects of the present disclosure can be implemented with and/or within any one or more of numerous devices, ranging from self-contained devices, such as a smartphone, tablet, computer, laptop computer, desktop computer, server, or web-server, to a network of two or more of any of these devices. Fundamentally, there is no limitation on the physical construct of electronic commerce system 204, as long as it can provide one or more of the features and functionality described herein. For example, electronic marketplace 200 and other aspects of electronic commerce system 204 may be contained within and/or implemented by one or more supplier or price-requester in-house systems, a CAD program, a centralized server, or a decentralized network of devices and/or software, among other implementations that will become readily apparent after reading this disclosure in its entirety. In some embodiments, depending on specific implementation, one or more steps of method 100 and/or any other method(s) incorporating features/functionality disclosed herein may be implemented substantially in real-time.

Prior to describing exemplary method 100, parts of electronic commerce system 204 will first be described to provide an exemplary context for method 100. Referring to FIG. 2, system 204 may include a plurality of suppliers 208(1) to 208(N), such as "Supplier 1" 208(1), "Supplier 2" 208(2), and "Supplier 3" 208(3) and up to any number of suppliers (designated by "Supplier N" 208(N)), that may associate one or more prices with or cause one or more prices to be generated by a custom pricing engine for one or more projects provided to electronic marketplace 200 by one or more designers 212(1) to 212(N), such as "Designer 1" 212(1). As a particular non-limiting example, suppliers 208(1) to 208(N) may comprise one or more fabricators of sheet-metal parts, while designers 212(1) to 212(N) may comprise one or more entities that design sheet-metal parts and/or assemblies of parts, purchasing agents associated with such entities, customers of such entities, or other users or entities that wish to generate a price for a particular design. Electronic marketplace 200 is configured to allow designers 212(1) to 212(N) to each submit one or more requests for pricing for fabrication projects associated with one or more designs and to allow any one or more of suppliers 208(1) to 208(N), such as Supplier 1 208(1) for instance, to provide a pricing for or cause a custom pricing engine to provide a pricing for any one or more of the projects in the marketplace that is/are open for pricing. A unique feature of electronic marketplace 200 is that it can allow a user to specify a custom pricing engine, then utilize that custom pricing engine to generate pricing information, such as pricing information 216, as a function of one or more design documents provided by one or more designers. This functionality allows the process of producing prices to be customized and streamlined, which can result in lower prices for both suppliers and designers and effect a shorter overall design cycle.

In the context of electronic marketplace 200 of FIG. 2, aspects of the present invention are implemented in software 220, which in this example provides a general user interface 224, such as a graphical user interface, operable to allow each supplier 208(1) to 208(N) and designer 212(1) to 212(N) to interact with and participate in the electronic marketplace. Additionally or alternatively, each supplier 208(1) to 208(N) and/or designer 212(1) to 212(N) may utilize in-house software, such as one or more CAD software applications, with custom interfaces to interact with and participate within marketplace 200. Electronic marketplace 200 also includes a memory 228 that holds and/or stores a variety of information, including, but not limited to, design document(s) 232, a pricing engine variables database 236, pricing engine equations 240, pricing information 216, and, optionally, a template 244. Each design document 232 may be, for example, a CAD file containing one or more 3D CAD models and/or may contain one or more records of various geometric and/or feature data associated with one or more designs and/or CAD models that may be needed for automatedly generating a price in accordance with the present invention. Pricing engine variables database 236 may contain information specifying costs for performing one or more processes and/or working one or more materials, such as stainless steel dollars per cubic inch or pound or welding dollars per hour, among others, either generally, for example, as an average of one or more suppliers or as otherwise determined by marketplace 200 or an administrator thereof, and/or particularly for one or more suppliers or groups of suppliers. Supplier-specific information for populating pricing engine variables database 236 may be provided directly to marketplace 200 by one or more suppliers, such as one or more of suppliers 208(1) to 208(N), determined by the marketplace as a function of supplier activity and/or by interfacing with one or more supplier systems, and/or provided by a third party.

Pricing engine equations 240, which may be stored in a composite-pricing-engine database (not shown), may include equations and/or algorithms that can be used to calculate pricing information 216 as a function of one or more of pricing engine information in pricing engine variables database 236, information in design document(s) 238, and a supplier selected by a designer of a particular design document, among other things that will be apparent to one of ordinary skill in the art upon reading this disclosure in its entirety. Such equations and/or algorithms may be provided directly to marketplace 200 by one or more suppliers, determined by the marketplace as a function of supplier activity and/or by interfacing with one or more supplier systems, and/or provided by a third party. Pricing information 216 may comprise a total cost for manufacturing a structure or set of structures, a run cost per unit or structure manufactured, a material cost per unit, and/or a set-up cost per unit, as desired. Optional template 244 may comprise a form or other data structure that electronic marketplace 200 may present or transmit to one or more users in order to allow the user(s) to provide one or more design documents, pricing engine variables and/or associated costs, and/or pricing engine equations, each optionally as a function of one or more standardized pricing input and/or output, such as a quantity of parts or structures or a desired lead-time, to the marketplace to be stored in design document(s) 232, pricing engine variables database 236, and/or pricing engine equations 240, respectively.

General user interface 224 may be designed and configured to allow any of designers 212(1) to 212(N) to solicit a pricing within, or otherwise interact with, electronic marketplace 200, including providing each designer the ability to upload a request for price and/or design documents and to provide any other information necessary. Electronic marketplace 200 may then communicate designer-provided information or otherwise make the information available to one or more aspects of the electronic marketplace, such as custom pricing engine module 248, custom pricing interface 252, interrogator engine 256, design document(s) 232 or other components of memory 228, and/or general user interface 224. In some embodiments, marketplace 200 may generate pricing information as a function of one or more of pricing engine variables database 236, design document(s) 238, and a supplier selected by a designer of a particular design document using one or more standard pricing engines included in and/or generated by the marketplace and transmit the pricing information to the designer requesting the price. In some embodiments, pricing engine variables database 236 may comprise standardized pricing input(s) used by a standard pricing engine and pricing information 216 may comprise standardized pricing output(s) produced by such a standard pricing engine. General user interface 224 may be further designed and configured to allow any of suppliers 208(1) to 208(N) to place bids in response to designer price solicitations within, or otherwise interact with, electronic marketplace 200, including providing each supplier the ability to upload bids or other information.

Memory 228 may represent any part, or the entirety of the memory used by electronic marketplace 200 in providing its functionality. Depending upon the particular implementation at issue, memory 228 may be volatile memory, such as primary storage memory (e.g., random-access memory (RAM) or cache memory, etc.), non-volatile memory, such as secondary storage memory (e.g., a magnetic drive, optical drive, etc.), and any combination thereof and in any number of memory devices. In embodiments wherein electronic marketplace 200 undertakes the task to collect and store information for use in pricing engine variables database 236 and/or pricing engine equations 240, memory 228 will typically be one or more secondary storage devices. In embodiments wherein electronic marketplace 200 collects data in real time, such as from current activity in the marketplace or from data stores of one or more individual suppliers 208(1) to 208(N) and/or designers 212(1) to 212 (N) in conjunction with generating pricing information, memory 228 may only need to be a primary memory. Those skilled in the art will readily understand the types of memory(ies) needed for memory 228 for any particular instantiation of an electronic marketplace of the present invention. Though not explicitly shown, memory 228 and each component thereof may comprise one or more databases or other appropriate data structures.

As briefly referred to above and as illustrated in FIG. 2, software 224 may be considered to include a custom pricing engine module 248, a custom pricing interface 252, and, optionally, an interrogator engine 256. Notably, in some embodiments, portions of software 224 may be distributed among separate systems. For example, a designer's CAD program may comprise an interrogator engine that interfaces with or generates data to be communicated to a custom pricing engine module at a separate location, such as a centralized server or a supplier's in-house system. Custom pricing engine module 248 may execute various custom pricing engines defined by one or more designers, suppliers, and/or third-parties, who may utilize custom pricing interface 252, which may also function as a composite-pricing-engine user interface, to upload specifications, such as one or more equations or algorithms, of such custom pricing engines to marketplace 200, which the custom pricing interface and/or the custom pricing engine module may then store in pricing engine equations 240. Marketplace 200 may then derive pricing engine variables to be stored in pricing engine variables database 236 as a function of supplier activity and/or may receive such pricing engine variables directly from one or more suppliers. Users such as designers and suppliers may then access marketplace 200 via general user interface 224 or custom pricing interface 252, optionally upload one or more design documents, and utilize such custom pricing engines to generate pricing information (such as standardized pricing output) as a function of one or more design documents or data derived therefrom (such as standardized pricing input) using locally and/or remotely stored algorithms and/or by interfacing with one or more human individuals, such as one or more underwriters. Notably, although custom pricing interface 252 and general user interface 224 are shown in FIG. 2 and described herein as separate components, they may be combined into a single interface in some embodiments. Further, as noted previously, one or more components of electronic marketplace 200 may be contained within and/or implemented by one or more supplier or price-requester in-house systems, a CAD program, a centralized server, or a decentralized network of devices and/or software, among other suitable implementations.

Interrogator engine 256 may automatedly extract information from one or more design documents, such as one or more of design document(s) 232, using, for example, geometry analysis and/or one or more extraction algorithms, among other things, in order to provide standardized or custom pricing input to custom pricing engine module 248. In some embodiments, suppliers or others, such as one or more suppliers 208(1) to 208(N) or third parties 260(1) to 260(N), may customize aspects of interrogator engine 256 by transmitting information to marketplace 200 via, e.g., template 244 and/or custom pricing interface 252, in order to cause the interrogator engine to generate standardized input or custom pricing input as a function of one or more design documents, which may comprise one or more CAD files and/or models, using custom methods preferred by the suppliers or others. Such a custom interrogator engine may be designed and configured in conjunction with a custom pricing engine such that the information produced by the custom interrogator engine can be directly used in the custom pricing engine. It is noted that while the term "module" is used herein, this term is not intended to require any particular configuration of the corresponding software code. For example, "module" should not be construed to mean that the software code is embodied in a discrete set of code independent of the software code for software 220. Rather, the term "module" is used herein merely as a convenient way to refer to the underlying functionality.

As will be understood by reading this entire disclosure, operations, and pricing information that custom pricing engine module 248 can be configured to perform and provide, respectively, are varied and diverse. For example, custom pricing engine module 248 may receive specifications for a custom pricing engine from a supplier via custom pricing interface 252, store the specifications in pricing engine equations 240, receive a custom pricing request from a designer, supplier, or other user, determine standardized and/or custom pricing input as a function of one or more design documents, generate pricing information using one or more pricing engine equations, and transmit the pricing information to the user who requested the custom pricing request. Additionally or alternatively, custom pricing engine module 248 may cause custom pricing interface 252 to display a template, such as a template stored in template 244, to a user, such as a designer, supplier, and/or third party in order to obtain information from one or more of such entities as may be required for producing pricing information.

As briefly discussed above, one or more third parties 260(1) to 260(N), such as "Third Party 1" 260(1), "Third Party 2" 260(2), and "Third Party 3" 260(3) and up to any number of suppliers (designated by "Third Party N" 260(N)), may access electronic marketplace 200 in addition to suppliers and designers and form a portion of electronic commerce system 204. Third parties may comprise, for example, one or more individuals, brokers, and/or other businesses. Third parties may utilize custom pricing interface 252 and may store equations and/or algorithms associated with one or more custom pricing engines in pricing engine equations 240 such that custom pricing engine module 248 may generate pricing information as a function of such pricing engines and one or more design documents or data derived therefrom. Additionally or alternatively, third parties may retain such equations and algorithms in local systems and generate pricing information with or without utilizing custom pricing engine module 248 of marketplace 200. In one example, a third party, such as Third Party 1 260(1), may offer their custom pricing engine(s) to one or more supplier, designer, or other user of marketplace 200, allowing them to generate pricing information that may be more accurate, relevant, or otherwise desirable than any standard pricing engines that may be included in electronic marketplace 200. Third parties may offer use of such custom pricing engine(s) to users of electronic marketplace 200, such as one or more designers, suppliers, or other users, for a one-time purchase fee, a monthly fee, or at no cost, among other subscription or purchasing agreements known in the art, and the one or more designers or suppliers may then utilize the custom pricing engine(s) in the context of marketplace 200. Notably, in some embodiments, one or more suppliers, designers, or other users, such as one or more third parties, may upload equations and/or algorithms for one or more custom pricing engines to electronic marketplace 200, which may then store the equations and/or algorithms in pricing engine equations 240 for use in generating pricing information via custom pricing engine module 248. These suppliers, designers, and/or other users may then sell or otherwise make available these custom pricing engines to other designers, suppliers, or other users of marketplace 200. In some embodiments, marketplace 200 may handle licensing and rights to such custom pricing engines for individual users or groups of users.

For the sake of completeness, it is noted that the unlabeled arrows in FIG. 2 represent temporary and/or permanent data connections that enable data communication between various components of electronic marketplace 200. These connections may be implemented in the form of, for example, data buses, Internet connections, local network connections, and/or any other connections between electronic devices or portions of one or more devices.

With the context of electronic commerce system 204 established and referring again to FIG. 1, and also FIG. 2, method 100 may optionally begin with or be preceded by software 220 of electronic marketplace 200 providing a custom pricing interface 252 to one or more users of the marketplace, such as one or more of suppliers 208(1) to 208(N), designers 212(1) to 212(N), and/or third parties 260(1) to 260(N). Custom pricing interface 252 may be designed and configured to allow a user to provide a custom pricing engine that operates on pricing input from design document(s) 232 to produce standardized pricing output. In some embodiments, such a custom pricing engine may be a pre-created pricing engine supplied by any one of suppliers 208(1) to 208(N), designers 212(1) to 212(N), and third parties 260(1) to 260(N). Further, in some embodiments, custom pricing interface 252 may include or otherwise provide a template, such as template 244, to any one or more of such users so as to allow them to build their own custom pricing engine, for example, from parts of preexisting pricing engines, from scratch, and/or from other sources. For example, a user may desire to use a "laser cut by energy" calculation from one pricing engine and a "laser cut set up by size" calculation from another pricing engine to build a custom, composite pricing engine. A template may comprise a number of identifiers, such as "stainless steel dollars per sheet," "welding dollars per hour," "laser cutting dollars per hour," "laser cutting inches per hour," "and laser cutting setup time hours," among others, with corresponding data entry fields that one or more users may populate with corresponding values. Marketplace 200 may then store these values in association with one or more suppliers, as appropriate, in pricing engine variables database 236.

Electronic marketplace 200, such as via software 224, may receive a custom pricing engine, comprising algorithms and/or equations, via custom pricing interface 252 from a designer, supplier, or third party, for example, through template 244 or otherwise, such as via an uploading of a pre-existing custom pricing engine. Marketplace 200 may then store the specifications for the custom pricing engine in pricing engine equations 240. Referring again to FIG. 1, and also to FIG. 2, at step 105 electronic commerce system 200 may receive the pricing input that the custom pricing engine will use to generate the standardized pricing output that the electronic commerce system 200 is configured to handle. Step 105 may be performed in any of a variety of ways, such as using an interrogator engine, such as interrogator engine 256, that automatedly interrogates the one or more designs in on or more of design document(s) 232 relevant to a particular pricing inquiry and generates standardized pricing inputs as a function of the design document(s). As described elsewhere herein, any interrogator engine used may be a custom interrogator engine provided, for example, by any one of suppliers 208(1) to 208(N), designers 212(1) to 212(N), and third parties 260(1) to 260(N). As also described herein, the pricing input may be a standardized pricing input that the electronic commerce system is configured to use in the normal course of using standard pricing engines, a custom pricing input adapted especially for the custom pricing engine at issue, or a combination of both standardized and custom pricing input, as required by a particular implementation and/or preferred by a user.

At step 110, custom pricing engine module 248 may execute the custom pricing engine, which may comprise a portion of each of a plurality of pricing engines, as a function of the pricing input to generate the standardized pricing output for fabrication of a structure represented in a design document. For example, a designer, such as Designer 1 212(1), may request pricing information based on a custom pricing engine uploaded by a third party, such as Third Party 1 260(1), and one or more design documents previously or concurrently uploaded to marketplace 200 and optionally stored in design document(s) 232 through general user interface 224 or custom pricing interface 252, and such a request may cause software 220 to execute step 110. As those skilled in the art will readily appreciate, since the output of the custom pricing engine may be standardized, electronic commerce system 200 system can process such standardized output in the same manner that it would process the output of any standard pricing engine. For example, software 220 may store generated pricing information in pricing information 216 and/or provide the pricing information to a user, such as a designer or other user that has requested pricing information (Designer 1 212(1) in the example above) and/or any suppliers associated with the pricing information. Marketplace 200 may provide the pricing information by presenting details thereof to the intended recipient(s) via one or more of general user interface 224, custom pricing interface 252, a CAD software application, and/or by any other means known in the art for providing pricing information to users.

At step 115, custom pricing engine module 248 may aggregate one or more of the pricing outputs generated at step 110, which may correspond to component and/or total prices calculated using each of a plurality of pricing engines, in order to obtain an overall, aggregated price. Such aggregation may comprise averaging, summing, or utilizing any other suitable mathematical combination of the pricing outputs generated at step 110. Those skilled in the art will readily understand that various algorithms and calculations can be implemented to provide pricing information to one or more users and that such algorithms and calculations need not utilize all possible standardized pricing input nor produce all possible standardized pricing output. Further, those skilled in the art will readily be able to implement any suitable algorithm and/or calculation scheme within the framework of the present invention without undue experimentation. For example, various statistical and other mathematical calculations and algorithms may be used. In some embodiments, marketplace 200 may perform error-checks, either routinely or by request, in order to verify that any custom pricing engines received are properly configured.

At step 120, marketplace 200 may provide the overall, aggregated price generated at step 115 by presenting details thereof to the intended recipient(s) via one or more of general user interface 224, custom pricing interface 252, a CAD software application, and/or by any other means known in the art for providing pricing information to users. It is noted that while steps 105, 110, 115, and 120 have been described in a particular order for the sake of illustration, those skilled in the art will understand that the described order is not necessarily the only ordering for these steps. Rather, the only order necessary is the order imposed by necessity. For example, an overall, aggregated price cannot be offered to a designer or supplier before it exists. It is also noted that the steps illustrated are only the steps needed to illustrate certain aspects of the invention and that other steps, such as steps of retrieving and storing information, may be utilized in conjunction with performing the steps illustrated as needed for embodying a particular implementation.

Figure 3:
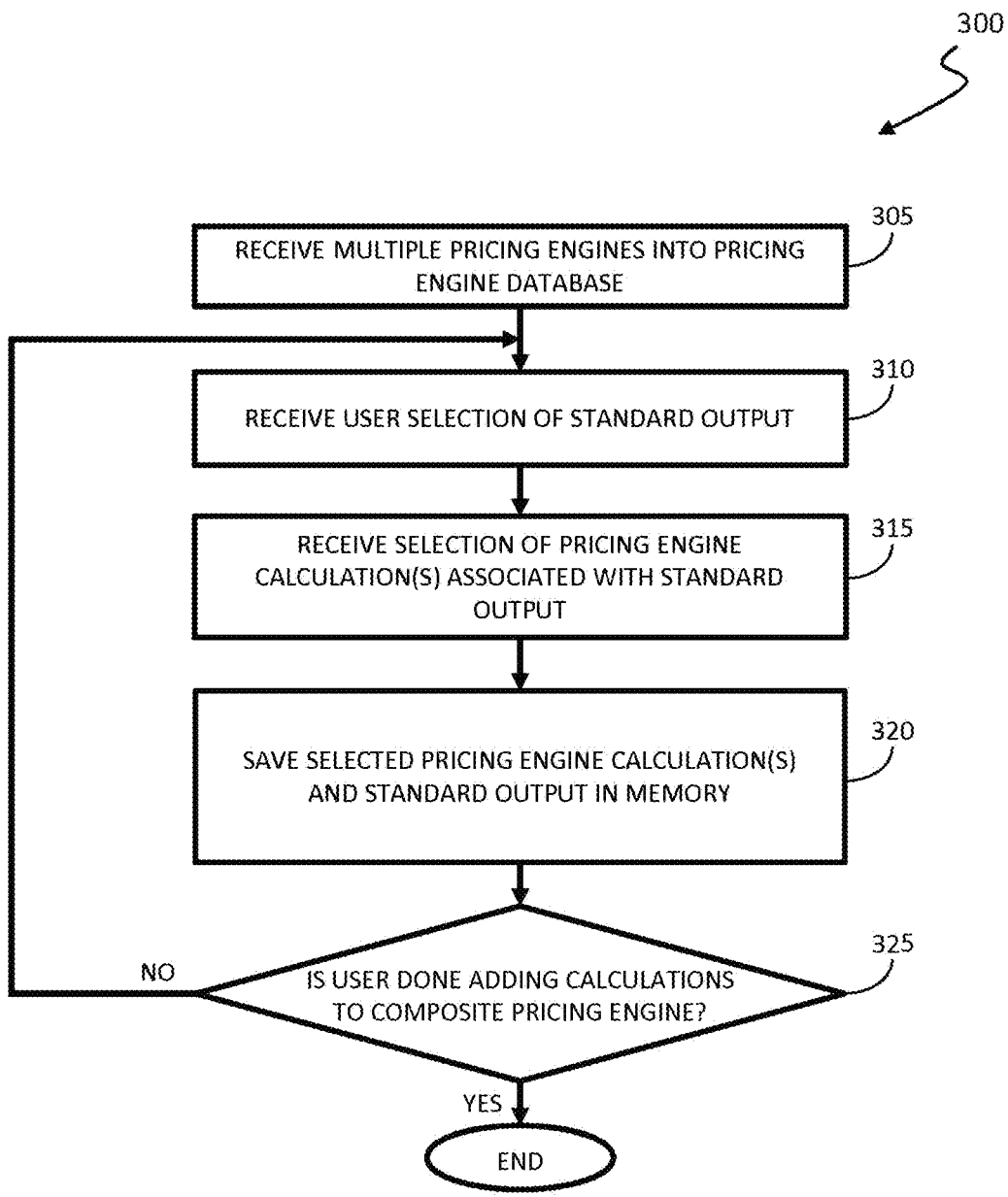
FIG. 3 is a flow diagram illustrating a method of creating a composite pricing engine.

FIG. 3 illustrates an exemplary method 300 of creating a custom pricing engine. Referring now to FIG. 3, and also to FIG. 2, at step 305 of method 300 software 220 may receive equations and/or algorithms for a plurality of pricing engines from one or more users, such as one or more designers, suppliers, or other third parties, of marketplace 200 via, for example, custom pricing interface 252, general user interface 224, or template 244, and store them in pricing engines equations 240. At step 310, software 220 may receive a user selection of a standardized output, such as a material cost per unit, run cost per unit, or set up cost, among others, via custom pricing engine module 248 and/or template 244. Software 220 may then identify one or more pricing engine calculations stored in pricing engine equations 240 or otherwise available to marketplace 200 that are associated with the standard outputs selected and present, such as via a display or other means, the identified pricing engine calculations to a user. At step 315, software 220 may receive selection of pricing engine calculation(s) associated with the standard outputs selected at step 310 from a user, such as via custom pricing engine module 248 and/or template 244. At step 320, software 220 may save the pricing engine calculation(s) received at step 315 in pricing engine equations 240 as part of a custom or composite pricing engine and/or the standard outputs selected at step 310 in pricing engine variables database 236. At step 325, software 220 may display a dialogue or otherwise solicit a response from the user to determine whether the user is done adding calculations to the composite pricing engine via custom pricing engine module 248, general user interface 224, custom pricing interface 252, and/or template 244, and, if the user wishes to add more calculations, method 300 may proceed to step 310. If the user is done adding calculations to the composite pricing engine, method 300 may terminate after step 325.

For the convenience of presenting concrete, yet simple, examples of a variables that may be stored in pricing engine variables database 236 and pricing engines that may be stored in pricing engine equations 240, the following Tables are provided. However, it is emphasized that these are merely examples. For example, Table I, below, provides a number of exemplary variables that may be stored in pricing engine variables database 236 and used by one or more pricing engines.

TABLE I

| Variable | Definition |
|---|---|
| L | Length of initial sheet metal part |
| W | Width of initial sheet metal part |
| T | Thickness of initial sheet metal part |
| NoSheets | Number of stock sheet metal sheets needed to manufacture one unit |
| VolSheet | Volume of a stock sheet metal sheet |
| MatSS | Cost of stainless steel per cubic inch |
| MatAL | Cost of aluminum per cubic inch |
| CutL | Length of all cuts (in inches) in a unit |
| CutLN | Length of a specific cut (in inches) in a unit |
| LCutperH | Number of inches a laser cutter may cut in 1 hour |
| LCut$perHr | Cost to operate the laser cutter per hour |
| LCutSetUp | Time to set up the laser cutter for a job |

Table II, below, provides two example pricing engines that utilize the variables of Table I and that may be stored in pricing engine equations 240 such that users of marketplace 200 can utilize them.

TABLE II

| Standard Output | Material Cost per unit--SS | Material Cost per unit--AL | Run Cost per unit-Laser Cutting | Set up Cost-Laser Cutting |
|---|---|---|---|---|
| Pricing Engine 1 | L × W × T × MatSS | L × W × T × MatAL | CutL/LCutperH × LCut$perHr | LCutSetUp × LCut$perHr |
| Pricing Engine 2 | NoSheets × VolSheet × MatSS | NoSheets × VolSheet × MatAL | (((CutL1/LCutperH) + .1) × LCut$perHr) + (((CutL2/LCutperH) + .1) × LCut$perHr) | (LCutSetUp + .15) × LCut$perHr |

Table III, below, provides an example of a composite pricing engine that utilizes a portion of each of the "Pricing Engine 1" and "Pricing Engine 2" shown in Table II. In particular, this composite pricing engine uses "material cost per unit" calculations for stainless steel (SS) and aluminum (AL) and a "set up cost" calculation for laser cutting drawn from "Pricing Engine 1," while simultaneously utilizing a "run cost per unit" calculation for laser cutting from "Pricing Engine 2."

TABLE III

| Standard Output | Sourcing ID | Calculation |
|---|---|---|
| Material Cost per unit--SS | Pricing Engine 1 | L × W × T × MatSS |
| Material Cost per unit--AL | Pricing Engine 1 | L × W × T × MatAL |
| Run Cost per unit-Laser Cutting | Pricing Engine 2 | (((CutL1/LCutperH) + .1) × LCut$perHr) + (((CutL2/LCutperH) + .1) × LCut$perHr) |
| Set up Cost-Laser Cutting | Pricing Engine 1 | LCutSetUp × LCut$perHr |

As would be apparent to one reasonably skilled in the art, the invention may be applied to other manufacturing types, including but not limited to the manufacture of apparel. Both sheet metal and apparel designers use CAD systems to design their products, using sheets of flat material for manufacture. Design data, such as material choice, precise dimensions, or locations of additional features may be embedded within the digital design. Designers may choose different metals or fabrics (including non-woven materials such as leather) depending on the strength and other inherent properties of the material, which affects what manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units may be moved from station to station during manufacture. Whereas sheet metal is typically connected by rivets or welding, sheet fabric is typically connected by stitching or gluing. Surface finishes may be applied to both; both may be painted, silk-screened, or otherwise covered with a protective substance.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory (ROM) device, a RAM device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 4:
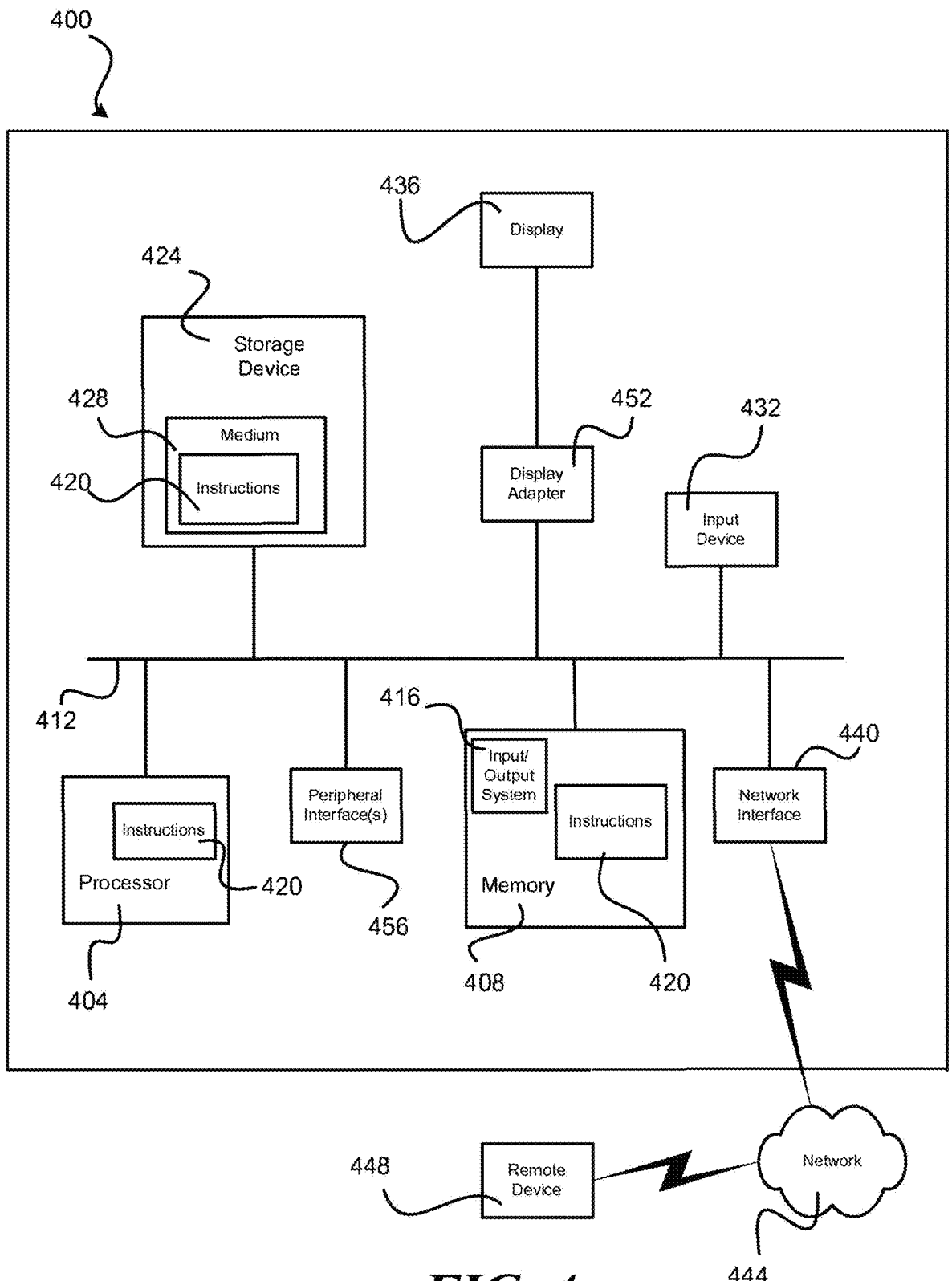
FIG. 4 is a block diagram of a computing system that can be used to implement any one or more of the methodologies disclosed herein and any one or more portions thereof.

FIG. 4 shows a diagrammatic representation of one embodiment of a computing device in the exemplary form of a computer system 400 within which a set of instructions for causing a control system, such as the electronic commerce system 204 of FIG. 2, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 400 includes a processor 404 and a memory 408 that communicate with each other, and with other components, via a bus 412. Bus 412 may include any of several types of bus structures including, but not limited to, a memory bus, a memory controller, a peripheral bus, a local bus, and any combinations thereof, using any of a variety of bus architectures.

Memory 408 may include various components (e.g., machine readable media) including, but not limited to, a random-access memory component, a read only component, and any combinations thereof. In one example, a basic input/output system 416 (BIOS), including basic routines that help to transfer information between elements within computer system 400, such as during start-up, may be stored in memory 408. Memory 408 may also include (e.g., stored on one or more machine-readable media) instructions (e.g., software) 420 embodying any one or more of the aspects and/or methodologies of the present disclosure. In another example, memory 408 may further include any number of program modules including, but not limited to, an operating system, one or more application programs, other program modules, program data, and any combinations thereof.

Computer system 400 may also include a storage device 424. Examples of a storage device (e.g., storage device 424) include, but are not limited to, a hard disk drive, a magnetic disk drive, an optical disc drive in combination with an optical medium, a solid-state memory device, and any combinations thereof. Storage device 424 may be connected to bus 412 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 424 (or one or more components thereof) may be removably interfaced with computer system 400 (e.g., via an external port connector (not shown)). Particularly, storage device 424 and an associated machine-readable medium 428 may provide nonvolatile and/or volatile storage of machine-readable instructions, data structures, program modules, and/or other data for computer system 400. In one example, software 420 may reside, completely or partially, within machine-readable medium 428. In another example, software 420 may reside, completely or partially, within processor 404.

Computer system 400 may also include an input device 432. In one example, a user of computer system 400 may enter commands and/or other information into computer system 400 via input device 432. Examples of an input device 432 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 432 may be interfaced to bus 412 via any of a variety of interfaces (not shown) including, but not limited to, a serial interface, a parallel interface, a game port, a USB interface, a FIREWIRE interface, a direct interface to bus 412, and any combinations thereof. Input device 432 may include a touch screen interface that may be a part of or separate from display 436, discussed further below. Input device 432 may be utilized as a user selection device for selecting one or more graphical representations in a graphical interface as described above.

A user may also input commands and/or other information to computer system 400 via storage device 424 (e.g., a removable disk drive, a flash drive, etc.) and/or network interface device 440. A network interface device, such as network interface device 440, may be utilized for connecting computer system 400 to one or more of a variety of networks, such as network 444, and one or more remote devices 448 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus, or other relatively small geographic space), a telephone network, a data network associated with a telephone/voice provider (e.g., a mobile communications provider data and/or voice network), a direct connection between two computing devices, and any combinations thereof. A network, such as network 444, may employ a wired and/or a wireless mode of communication. In general, any network topology may be used. Information (e.g., data, software 420, etc.) may be communicated to and/or from computer system 400 via network interface device 440.

Computer system 400 may further include a video display adapter 452 for communicating a displayable image to a display device, such as display device 436. Examples of a display device include, but are not limited to, a liquid crystal display (LCD), a cathode ray tube (CRT), a plasma display, a light emitting diode (LED) display, and any combinations thereof. Display adapter 452 and display device 436 may be utilized in combination with processor 404 to provide graphical representations of aspects of the present disclosure. In addition to a display device, computer system 400 may include one or more other peripheral output devices including, but not limited to, an audio speaker, a printer, and any combinations thereof. Such peripheral output devices may be connected to bus 412 via a peripheral interface 456. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions, and additions may be made to that which is specifically disclosed herein without departing from the spirit and scope of the present invention.

What is claimed is:

1. A system for producing a price for fabricating a structure, the system comprising:
   a computing device, wherein the computing device is configured to: receive, from a user, a request for pricing, wherein receiving the request for pricing further comprises:
   generating a graphical user interface (GUI), the graphical user interface including a data structure including a form having a first user input for receiving a user command to upload a computer aided design (CAD) file;
   receiving an instruction to upload a CAD file containing a representation of a structure with a surface finish thereon to be manufactured, using the user input;
   uploading the CAD file over an electronic network;
   performing, using an interrogator engine, a geometric analysis and extraction algorithm on the representation of the structure with the surface finish thereon to be manufactured, wherein the geometric analysis further comprises:
   identifying, using the interrogator engine, at least a geometric datum associated with the structure including the surface finish thereon, wherein the interrogator engine is customized by transmitting information to a marketplace through at least a custom pricing interface, and wherein the interrogator engine is caused to generate standardized and custom pricing inputs as a function of the CAD file; and
   retrieving at least a pricing variable datum using the at least a geometric datum, wherein the at least a pricing variable datum includes a first pricing variable datum comprising a plurality of costs for working one or more materials required for the structure with the surface finish thereon to be manufactured, received directly from the supplier and a second pricing variable datum determined from a third-party device, wherein the third-party device is distinct from the supplier;
   generating, by the interrogator engine and as a function of the structure and the surface finish represented in the CAD file, the geometric analysis, and the extraction algorithm, at least one second pricing input in the form, the at least a second pricing input configured to receive at least a pricing input value from a user;
   transmitting, to the user a form configured to accept, from the user, the at least a pricing input value; and
   receiving, from the user and using the form, at the at least a second pricing input, the at least a pricing input value; produce a price for fabricating the structure with the surface finish thereon based on the request for pricing, the geometric analysis, as a function of the at least a first pricing variable datum, the at least a second pricing variable datum, and the at least a pricing input value;
   generate a pricing output in the GUI for displaying the price for fabricating the structure with the surface finish thereon; and display, using the pricing output, the price.

2. The system of claim 1, wherein producing the price further comprises calculating the price as a function of a material thickness.

3. The system of claim 1, wherein producing the price further comprises calculating the price as a function of a type of cut.

4. The system of claim 1, wherein the computing device is further configured to generate a second graphical user interface, wherein the second graphical user interface is configured to receive, from at least a supplier, a supplier pricing input.

5. The system of claim 4, wherein the computing device is further configured to calculate the price as a function of the supplier pricing input.

6. The system of claim 5, wherein the second graphical user interface is configured to display, to the at least a supplier, the calculated price.

7. The system of claim 1, wherein the computing device is further configured to: generate a pricing variable as a function of past supplier activity; and produce the price as a function of the pricing variable.

8. The system of claim 1, wherein the price is produced as a function of a desired lead time.

9. A method for producing a price for fabricating a structure, the method comprising:
   receiving, from a user, a request for pricing, wherein receiving the request for pricing further comprises:
   generating a graphical user interface (GUI), the graphical user interface including a data structure including a form having a first user input for receiving a user command to upload a computer aided design (CAD) file;
   receiving an instruction to upload a CAD file containing a representation of a structure with a surface finish thereon to be manufactured, using the first user input;
   uploading the CAD file over an electronic network;
   performing, using an interrogator engine, a geometric analysis and extraction algorithm on the representation of the structure with a surface finish thereon to be manufactured, wherein the geometric analysis further comprises:
   identifying, using the interrogator engine, at least a geometric datum associated with the structure including the surface finish thereon, wherein the interrogator engine is customized by a supplier by transmitting information to a marketplace through at least a custom pricing interface, and wherein the interrogator engine is caused to generated standardized and custom pricing inputs as a function of the CAD file; and retrieving at least a pricing variable datum using the at least a geometric datum, wherein the at least a pricing variable datum includes a first pricing variable datum comprising a plurality of costs for working one or more materials required for the structure with the surface finish thereon to be manufactured, received directly from the supplier and a second pricing variable datum determined from a third-party device, wherein the third-party device is distinct from the supplier;

generating, by the interrogator engine and as a function of the structure and the surface finish represented in the CAD file, the geometric analysis, and the extraction algorithm, at least one second pricing input in the form, the at least a second pricing input configured to receive at least a pricing input value from a user;

transmitting, to the user a form configured to accept, from the user, the at least a pricing input value; and receiving, from the user and using the form, at the at least a second pricing input, the at least a pricing input value; producing a price for fabricating the structure with the surface finish thereon based on the request for pricing, the geometric analysis as a function of the at least a first pricing variable datum, the at least a second pricing variable datum, and the at least a pricing input value;

generating a pricing output in the GUI for displaying the price for fabricating the structure with the surface finish thereon; and displaying, using the pricing output, the price.

10. The method of claim 9, wherein producing the price further comprises calculating the price as a function of a material thickness.

11. The method of claim 9, wherein producing the price further comprises calculating the price as a function of a type of cut.

12. The method of claim 9, further comprising generating a second graphical user interface, wherein the second graphical user interface is configured to receive, from at least a supplier, a supplier pricing input.

13. The method of claim 12, wherein the computing device is further configured to calculate the price as a function of the supplier pricing input.

14. The method of claim 13, wherein the second graphical user interface is configured to display, to the at least a supplier, the calculated price.

15. The method of claim 9, further comprising:
generating a pricing variable as a function of past supplier activity; and
producing the price as a function of the pricing variable.

16. The method of claim 9, wherein the price is produced as a function of a desired lead time.

17. The system of claim 1, wherein the structure is an apparel including a fabric material.

18. The method of claim 9, wherein the structure is an apparel including a fabric material.

19. The system of claim 17, wherein the surface finish is a silk-screen on the fabric material.

20. The method of claim 18, wherein the surface finish is a silk-screen on the fabric material.

* * * * *